US011736108B2

United States Patent
Chao et al.

(10) Patent No.: US 11,736,108 B2
(45) Date of Patent: Aug. 22, 2023

(54) METHOD FOR PERFORMING DIVIDED-CLOCK PHASE SYNCHRONIZATION IN MULTI-DIVIDED-CLOCK SYSTEM, SYNCHRONIZATION CONTROL CIRCUIT, SYNCHRONIZATION CONTROL SUB-CIRCUIT, AND ELECTRONIC DEVICE

(71) Applicant: Faraday Technology Corp., Hsin-Chu (TW)

(72) Inventors: Ko-Ching Chao, Hsin-Chu (TW); Chih-Hung Wu, Hsin-Chu (TW); Po-Wen Hsiao, Hsin-Chu (TW); Zhou-Lun Liou, Hsin-Chu (TW)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 17/974,532

(22) Filed: Oct. 27, 2022

(65) Prior Publication Data
US 2023/0231560 A1   Jul. 20, 2023

(30) Foreign Application Priority Data
Jan. 14, 2022 (TW) ................... 111101630

(51) Int. Cl.
*H03L 7/00* (2006.01)
*G11C 11/4076* (2006.01)
(Continued)

(52) U.S. Cl.
CPC ............ *H03L 7/00* (2013.01); *G11C 11/4076* (2013.01); *H03K 19/21* (2013.01); *H03K 21/023* (2013.01)

(58) Field of Classification Search
CPC ....... H03L 7/00; G11C 11/4076; H03K 19/21; H03K 21/023
(Continued)

(56) References Cited

U.S. PATENT DOCUMENTS 6,067,632 A * 5/2000 Yamaguchi .......... G11C 7/1072
713/600
8,035,435 B1 * 10/2011 Shringarpure ..... H03K 5/15026
327/158
(Continued)

FOREIGN PATENT DOCUMENTS

| EP | 0 572 026 B1 | 12/1998 |
|----|---|---|
| TW | 201814700 A | 4/2018 |
| WO | 2019/076715 A1 | 4/2019 |

OTHER PUBLICATIONS

Texas Instruments Application Report SNAA294—Dec. 2019, "Multi-Clock Synchronization" Texas Instruments Incorporated, https://www.ti.com/lit/an/snaa294/snaa294.pdf?ts=1668036237449&ref_url=https%253A%252F%252Fwww.google.com%252F ,pp. 1-14, Dec. 2019.

*Primary Examiner* — Ryan Jager
(74) *Attorney, Agent, or Firm* — Winston Hsu

(57) ABSTRACT

A method for performing divided-clock phase synchronization in a multi-divided-clock system, an associated synchronization control circuit, an associated synchronization control sub-circuit and an associated electronic device are provided. The method may include: performing frequency division operations according to a source clock to generate a first divided clock and a second divided clock; performing phase relationship detection on the first divided clock according to the second divided clock to generate a phase relationship detection result signal; performing a logic operation on a first phase selection result output signal and the phase relationship detection result signal to generate a
(Continued)

second phase selection result output signal; and outputting one of the second divided clock and an inverted signal of the second divided clock according to the second phase selection result output signal, for further use in a physical layer circuit.

20 Claims, 9 Drawing Sheets

(51) Int. Cl.
*H03K 21/02* (2006.01)
*H03K 19/21* (2006.01)

(58) Field of Classification Search
USPC .......................................................... 327/144
See application file for complete search history.

(56) References Cited

U.S. PATENT DOCUMENTS

| | | | | |
|---|---|---|---|---|
| 9,460,791 B1* | 10/2016 | Shallal | ................. | G11C 7/1066 |
| 2009/0037800 A1* | 2/2009 | Chung | .............. | H03M 13/6575 |
| | | | | 714/E11.032 |
| 2009/0041104 A1* | 2/2009 | Bogdan | ................. | H03L 7/0995 |
| | | | | 375/226 |
| 2014/0240011 A1* | 8/2014 | Hoeppner | ................. | H03L 7/08 |
| | | | | 327/147 |
| 2016/0329085 A1* | 11/2016 | Yu | .......................... | G11C 7/222 |

* cited by examiner

METHOD FOR PERFORMING DIVIDED-CLOCK PHASE SYNCHRONIZATION IN MULTI-DIVIDED-CLOCK SYSTEM, SYNCHRONIZATION CONTROL CIRCUIT, SYNCHRONIZATION CONTROL SUB-CIRCUIT, AND ELECTRONIC DEVICE

BACKGROUND OF THE INVENTION

1. Field of the Invention

The present invention is related to synchronization of divided/frequency-divided clock, more particularly, to a method for performing divided-clock phase synchronization in a multi-divided-clock system, a related synchronization control circuit, a related synchronization control sub-circuit, and a related electronic device.

2. Description of the Prior Art

According to related art, a same clock may be utilized by a plurality of circuits in an electronic device, and more particularly, may be transformed into a plurality of divided clocks in the circuits, respectively, for further use. Some problems may occur, however. For example, the divided clocks may not be synchronized with each other, which may cause the electronic device to malfunction or not operate properly. In the related art, some advices are provided to try to address this problem, but may lead to additional problems (e.g. certain side effects). As a result, a novel method and related architecture are urgently needed, to implement an electronic device with reliable divided clock synchronization control without introducing any side effect or in a way that is less likely to introduce a side effect.

SUMMARY OF THE INVENTION

It is therefore an objective of the present invention to provide a method for performing divided-clock phase synchronization in a multi-divided-clock system, a related synchronization control circuit, a related synchronization control sub-circuit, and a related electronic device, to address the above-mentioned issues.

According to at least one embodiment of the present invention, a method for performing divided-clock phase synchronization in a multi-divided-clock system is provided. The method may include: utilizing a first frequency divider in a first synchronization control sub-circuit to perform a first frequency division operation according to a source clock, to generate a first divided clock; utilizing a second frequency divider in a second synchronization control sub-circuit to perform a second frequency division operation according to the source clock, to generate a second divided clock; utilizing the first synchronization control sub-circuit to output the first divided clock to the second synchronization control sub-circuit; utilizing the first synchronization control sub-circuit to output a first phase selection result output signal to the second synchronization control sub-circuit, wherein a logic value carried by the first phase selection result output signal indicates a first phase selection result of the first synchronization control sub-circuit; utilizing a phase relationship detection circuit in the second synchronization control sub-circuit to perform phase relationship detection on the first divided clock according to the second divided clock, to generate a phase relationship detection result signal, wherein a logic value carried by the phase relationship detection result signal indicates a phase relationship detection result of the second synchronization control sub-circuit; utilizing a logic gate in the second synchronization control sub-circuit to perform a logic operation on the first phase selection result output signal and the phase relationship detection result signal, to generate a second phase selection result output signal, wherein a logic value carried by the second phase selection result output signal indicates a second phase selection result of the second synchronization control sub-circuit; and utilizing the second synchronization control sub-circuit to output one of the second divided clock and an inverted signal of the second divided clock according to the second phase selection result output signal, for further use in a physical layer circuit equipped with the second synchronization control sub-circuit.

According to some embodiments of the present invention, a synchronization control circuit operated according to the above-mentioned method is provided, wherein the synchronization control circuit may include a plurality of synchronization control sub-circuits. For example, the plurality of synchronization control sub-circuits may be equipped with same circuit architecture and coupled to each other, more particularly, may be arranged to synchronizing divided clocks generated by respective frequency dividers of the plurality of synchronization control sub-circuits, wherein the plurality of synchronization control sub-circuits comprises the first synchronization control sub-circuit and the second synchronization control sub-circuit.

According to at least one embodiment of the present invention, a synchronization control sub-circuit is provided, wherein the synchronization control sub-circuit is one of a plurality of synchronization control sub-circuits in a synchronization control circuit. The synchronization control sub-circuit may include a frequency divider, a phase relationship detection circuit coupled to the frequency divider, a logic gate coupled to the phase relationship detection circuit, and a synchronized divided output clock pin. For example, the frequency divider may be arranged to perform a frequency division operation according to a source clock, to generate a divided clock. The phase relationship detection circuit may be arranged to perform phase relationship detection on another divided clock output by another synchronization control sub-circuit, to generate a phase relationship detection result signal, wherein a logic value carried by the phase relationship detection result signal indicates a phase relationship detection result of the synchronization control sub-circuit. The logic gate may be arranged to perform a logic operation on a first phase selection result output signal output by the another synchronization sub-circuit and the phase relation detection result signal, to generate a second phase selection result output signal, wherein a logic value carried by the first phase selection result output signal indicates a first phase selection result of the another synchronization control sub-circuit, and a logic value carried by the second phase selection result output signal indicates a second phase selection result of the synchronization control sub-circuit. Through the synchronized divided output clock pin, the synchronization control sub-circuit outputs one of the divided clock and an inverted signal of the divided clock according to the second phase selection result output signal, for further use in a physical layer circuit equipped with the synchronization control sub-circuit.

According to some embodiments of the present invention, an electronic device comprising the above-mentioned synchronization control sub-circuit is provided, wherein the electronic device may include a memory and a plurality of physical layer circuits coupled to the memory. For example, the memory may be arranged to temporarily store information for the electronic device. The plurality of physical layer circuits may be arranged to access the memory to execute operations of the electronic device, wherein each of the plurality of physical layer circuits comprises a corresponding synchronization control sub-circuit in the plurality of synchronization control sub-circuits.

One of the benefits of the present invention is that, through a carefully designed control mechanism, the method of the present invention may avoid any inversion errors of the respective divided clocks of the plurality of sub-circuits of the electronic device. As a result, it can be ensured that the electronic device can operate correctly in different situations. In addition, under the situation that a skew between the divided clocks is larger than 1T period of the reference clock, the method of the present invention can avoid the false lock problem. Compared with the related art, the method of the present invention can implement an electronic device with robust divided clock control synchronization control without introducing any side effect or in a way that is less likely to introduce a side effect.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
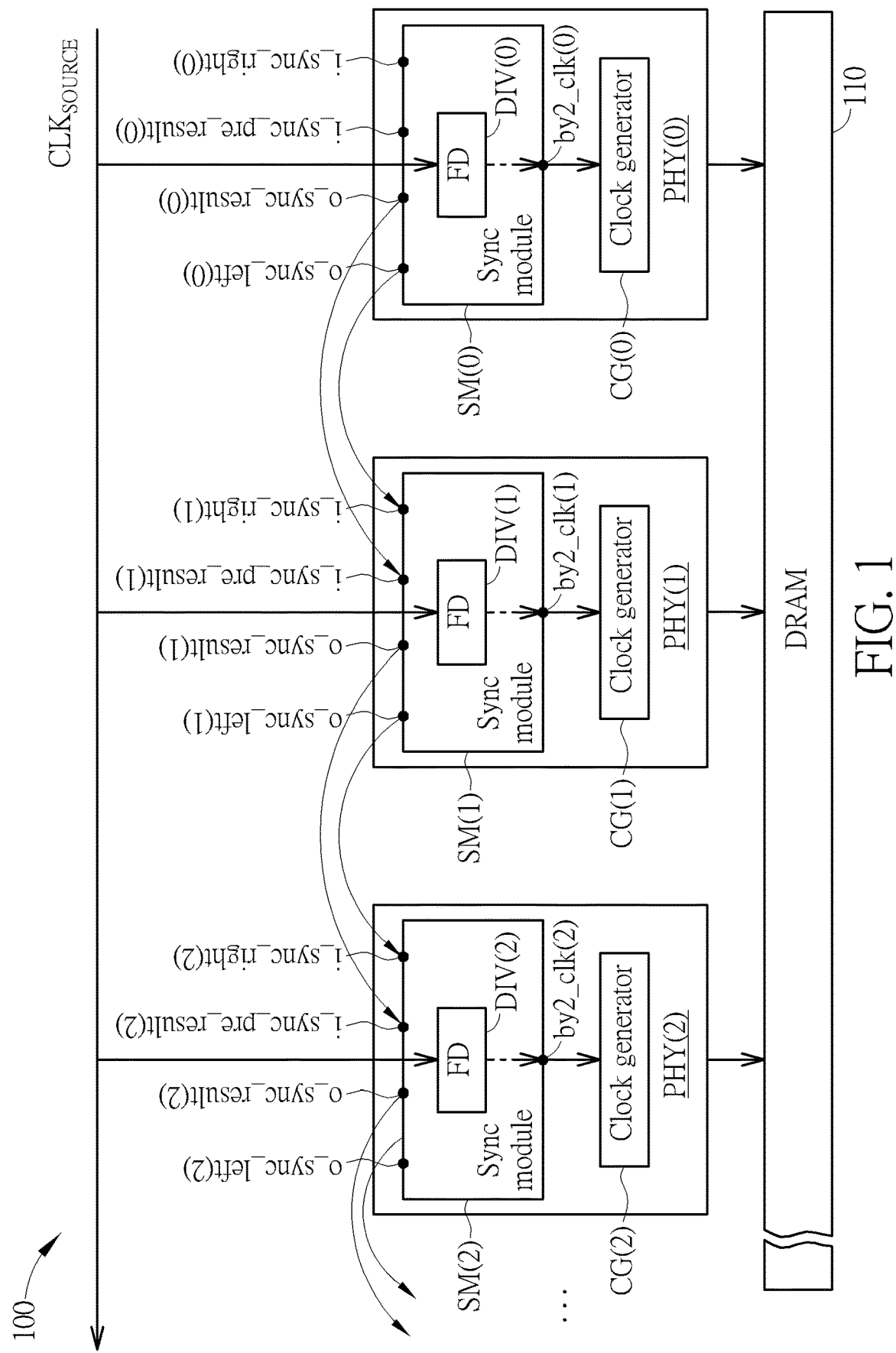
FIG. 1 is a diagram illustrating an electronic device equipped with divided clock synchronization control function according to an embodiment of the present invention.

FIG. 1 is a diagram illustrating an electronic device 100 equipped with divided clock synchronization control function according to an embodiment of the present invention.

The electronic device 100 may include a memory, such as a dynamic random access memory (DRAM) 110, and a plurality of physical layer circuits PHY(0), PHY(1), PHY(2), . . . . The memory (e.g. the DRAM 110) may be arranged to temporarily store information for the electronic device 100, and the physical layer circuits PHY(0), PHY(1), PHY(2), . . . may be arranged to access the memory (e.g. the DRAM 110) to execute operations of the electronic device 100. For example:

(1) the physical layer circuit PHY(0) may include a synchronization control sub-circuit (SCSC) equipped with a frequency divider (for brevity, labeled as "FD") DIV(0), such as a synchronization module (for brevity, labeled as "Sync module") SM(0), and may include a clock generator CG(0);

(2) the physical layer circuit PHY(1) may include a synchronization control sub-circuit equipped with a frequency divider DIV(1), such as a synchronization module SM(1), and may include a clock generator CG(1);

(3) the physical layer circuit PHY(2) may include a synchronization control sub-circuit equipped with a frequency divider DIV(2), such as a synchronization module SM(2), and may include a clock generator CG(1); and so on;

wherein each of the physical layer circuits PHY(0), PHY(1), PHY(2), may include a corresponding synchronization control sub-circuit in a plurality of synchronization control sub-circuits of a synchronization control circuit of the electronic device 100, but the present invention is not limited thereto. In addition, the clock generators CG(0), CG(1), CG(2), . . . may generate additional clocks according to divided clocks output by the synchronization modules SM(0), SM(1), SM(2), . . . , respectively, for further use in the physical layer circuits PHY(0), PHY(1), PHY(2), . . . .

For better comprehension, it is assumed that symbol "X" represents an integer greater than 1. The synchronization control circuit of the electronic device 100 may include X synchronization control sub-circuits, such as X synchronization modules {SM(0), . . . , SM(X−1)}, and X physical layer circuits {PHY(0), . . . , PHY(X−1)} of the electronic device 100 may include the X synchronization control sub-circuits equipped with X frequency dividers {DIV(0), . . . , DIV(X−1)}, respectively, such as X synchronization modules {SM(0), . . . , SM(X−1)}, and may include X clock generators {CG(0), . . . , CG(X−1)}, respectively. More particularly, the X synchronization control sub-circuits, such as the X synchronization modules {SM(0), . . . , SM(X−1)}, may be equipped with the same circuit architecture, and the synchronization control sub-circuit is configurable to allow the X synchronization control sub-circuits, such as the X synchronization modules {SM(0), . . . , SM(X−1)}, to couple to each other, to form the synchronization control circuit, for synchronizing divided clocks generated by respective frequency dividers {DIV(0), . . . , DIV(X−1)} of the X synchronization control sub-circuits. For example, in the synchronization control circuit, any two adjacent synchronization control sub-circuits in the X synchronization control sub-circuits, such as any two adjacent synchronization modules SM($x_0$) and SM($x_0$+1), may perform signal exchange in a manner similar to that between respective synchronization control sub-circuits of the physical layer circuits PHY(0) and PHY(1), such as the synchronization modules SM(0) and SM(1), or respective synchronization control sub-circuits of the physical layer circuits PHY(1) and PHY(2), such as the synchronization modules SM(1) and SM(2).

Figure 2:
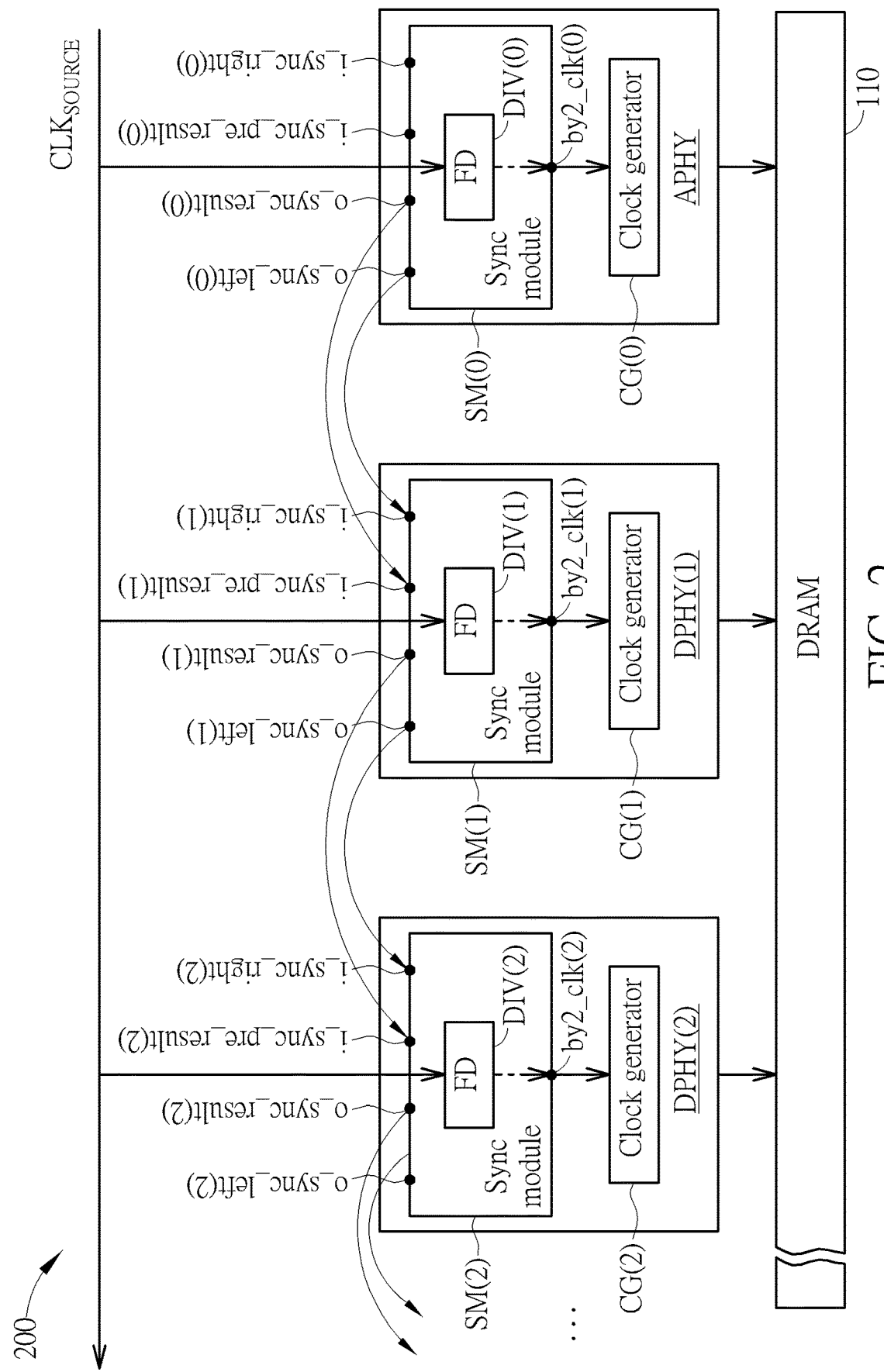
FIG. 2 is a diagram illustrating an electronic device equipped with divided clock synchronization control function according to another embodiment of the present invention.

FIG. 2 is a diagram illustrating an electronic device 200 equipped with divided clock synchronization control function according to another embodiment of the present invention. The electronic device 200 shown in FIG. 2 may be an example of the electronic device 100 shown in FIG. 1. More particularly, in the above-mentioned X physical layer circuits {PHY(0), . . . , PHY(X−1)}, the physical layer circuit PHY(0) may be implemented as a command/address physical layer circuit APHY, and the subsequent physical layer circuits, such as (X−1) physical layer circuits {PHY(1), PHY(2), . . . , PHY(X−1)} may be implemented as data physical layer circuit {DPHY(1), DPHY(2), . . . , DPHY (X−1)}, respectively, but the present invention is not limited thereto. In some embodiments, the number of X physical layer circuits {PHY(0), . . . , PHY(X−1)} may be very small (e.g. X=3). Under this situation, the (X−1) physical layer circuits {PHY(1), PHY(2), . . . , PHY(X−1)} may represent (3−1) physical layer circuits {PHY(1), PHY(2)}, wherein the physical layer circuits {PHY(1), PHY(2)} may be implemented as data physical layer circuits {DPHY(1), DPHY(2)}, respectively.

Figure 3:
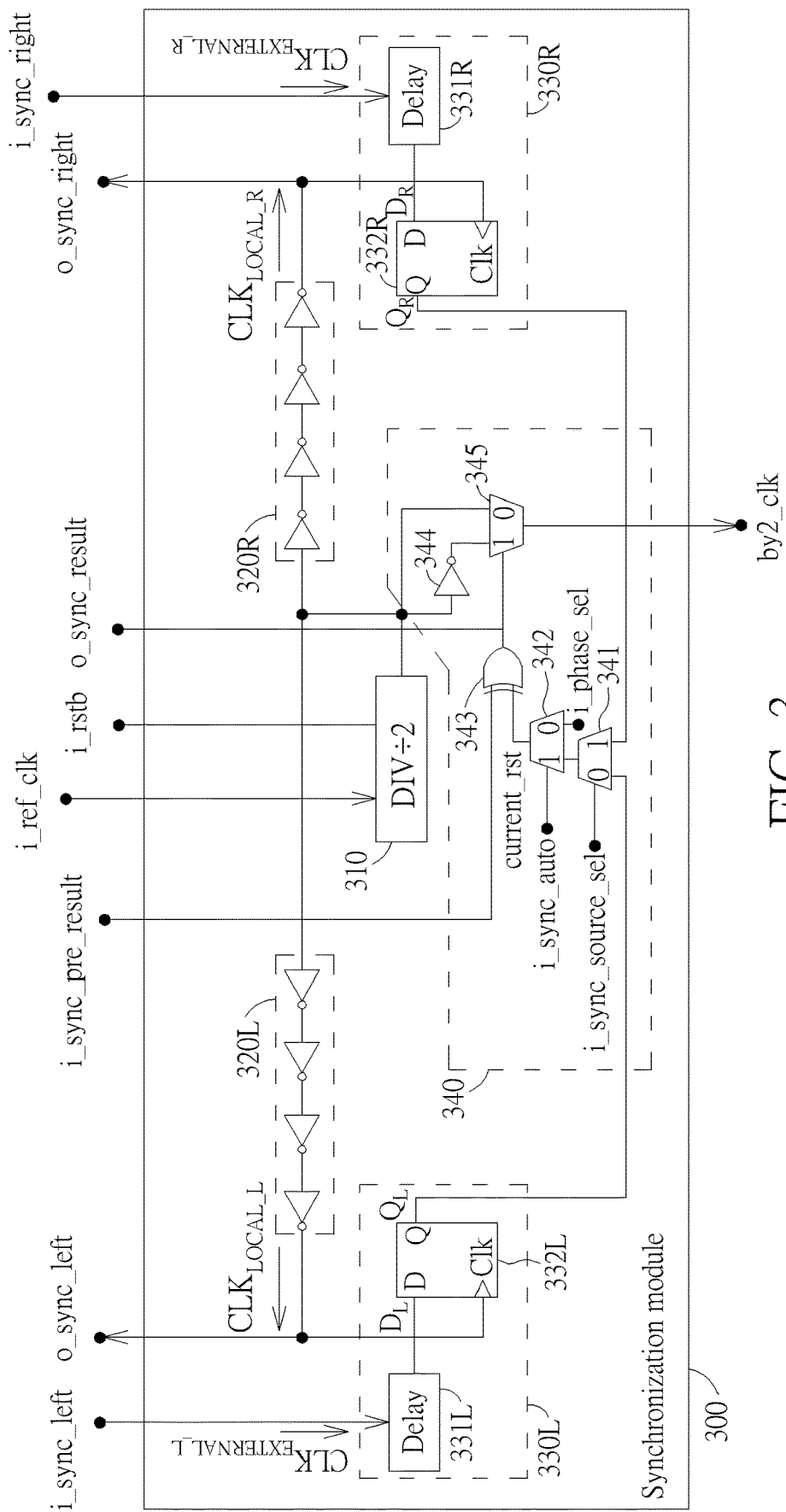
FIG. 3 is a diagram illustrating a synchronization result staticizing and automatic configuration control scheme of a method for performing divided-clock phase synchronization in a multi-divided-clock system according to an embodiment of the present invention.

FIG. 3 is a diagram illustrating a synchronization result staticizing and automatic configuration control scheme of a method for performing divided-clock phase synchronization in a multi-divided-clock system according to an embodiment of the present invention. The synchronization module 300 shown in FIG. 3 may act as an example of the X synchronization control sub-circuits, such as X synchronization modules {SM(0), SM(1), . . . , SM(X−1)}. More particularly, the X synchronization control sub-circuits, such as X synchronization modules {SM(0), SM(1), . . . , SM(X−1)}, may be equipped with the same circuit architecture, such as circuit architecture of the synchronization module 300.

The synchronization module 300 may include a frequency divider (e.g. a divide-by-2 frequency divider 310; for brevity, labeled as "DIV÷2" in FIG. 3), a plurality of delay line circuits 320L and 320R, a plurality of phase relationship detection circuits 330L and 330R, and a configurable phase control circuit 340. For example, each of the delay line circuits 320L and 320R may include a plurality of delay units, such as even number of inverters, but the present invention is not limited thereto. In addition, each of the phase relationship detection circuits 330L and 330R may be implemented by a delay circuit (for brevity, labeled as "Delay" in FIG. 3) and a D-type flip-flop, wherein the phase relationship detection circuit 330L may include a delay circuit 331L and a D-type flip-flop 332L, and the phase relationship detection circuit 330R may include a delay circuit 331R and a D-type flip-flop 332R. In addition, the configurable phase control circuit 340 may include a plurality of multiplexer circuits 341, 342, and 345, an exclusive OR (XOR) gate 343, and an inverter 344. As shown in FIG. 3, the synchronization module 300 may further include a plurality of terminals, such as a plurality of pins, and table 1 illustrates pin names of the pins, along with descriptions of these pins and/or their signals.

TABLE 1

| Pin name | Description of Pin and/or its signal |
| --- | --- |
| i_ref_clk | Input reference clock of the frequency divider |
| i_rstb | Active low reset pin of the frequency divider |
| i_sync_pre_result | Phase selection result of the previous stage |
| o_sync_result | Phase selection result of the current stage |
| i_sync_auto | Enable signal for automatic synchronization<br>1'b0 = enable<br>1'b1 = disable |

TABLE 1-continued

| Pin name | Description of Pin and/or its signal |
| --- | --- |
| i_phase_sel | Manual control signal for selecting phase of by2_clk<br>1'b0 = non-inverted<br>1'b1 = inverted |
| i_sync_source_sel | Control signal for selecting synchronization source<br>1'b0 = left side<br>1'b1 = right side |
| by2_clk | Synchronized divided output clock |
| i_sync_left | Input external divided clock from the left side module |
| i_sync_right | Input external divided clock from the right side module |
| o_sync_left | Output divided clock to the left side module |
| o_sync_right | Output divided clock to the right side module |

For better comprehension, signals that pass through the pins, respectively, may be named by the same names of the pins written in italics, and the related operations may be described as follows: (1) the input reference clock pin i_ref_clk (which may be written as i_ref_clk($x_0$), i_ref_clk ($x_0$+1), and i_ref_clk($x_0$+2) in the synchronization modules SM($x_0$), SM($x_0$+1), and SM($x_0$+2), respectively), arranged to receive an input clock signal i_ref_clk (e.g. the source clock $CLK_{SOURCE}$ shown in FIG. 1), to act as the input reference clock of the divide-by-2 frequency divider 310, wherein the divide-by-2 frequency divider 310 may perform a frequency division operation on the input clock signal i_ref_clk, to generate a divided clock at its output terminal, for being fed into the delay line circuits 320L and 320R and the configurable phase control circuit 340;

(2) reset pin i_rstb (which may be written as i_rstb($x_0$), i_rstb($x_0$+1), and i_rstb($x_0$+2) in the synchronization modules SM($x_0$), SM($x_0$+1), and SM($x_0$+2), respectively), arranged to receive a reset signal i_rstb, for resetting the divide-by-2 frequency divider 310; (3) previous stage phase selection result input pin i_sync_pre_result (which may be written as i_sync_pre_result(0), i_sync_pre_result(1), i_sync_pre_result(2), i_sync_pre_result($x_0$), i_sync_pre_result($x_0$+1), and i_sync_pre_result($x_0$+2) in the synchronization modules SM(0), SM(1), SM(2), SM($x_0$), SM($x_0$+1), and SM($x_0$+2), respectively), arranged to receive a previous stage phase selection result input signal i_sync_pre_result, such as the phase selection result input signal of the previous stage, wherein taking the connection method shown in FIG. 1 as an example, if the current stage (i.e. the synchronization module 300) represents the synchronization module SM(1), the previous stage may represent the synchronization module SM(0), or if the current stage (i.e. the synchronization module 300) represents the synchronization module SM(2), the previous stage may represent the synchronization module SM(1), and so on; (4) current stage phase selection result output pin o_sync_result (which may be written as o_sync_result(0), o_sync_result(1), o_sync_result(2), o_sync_result($x_0$), o_sync_result($x_0$+1), and o_sync_result($x_0$+2) in the synchronization modules SM(0), SM(1), SM(2), SM($x_0$), SM($x_0$+1), and SM($x_0$+2), respectively), arranged to output a current stage phase selection result output signal o_sync_result, such as the phase selection result output signal of the current stage, wherein taking the connection method shown in FIG. 1 as an example, the current stage (i.e. the synchronization module 300) may represent any of the synchronization modules SM(0), SM(1), and SM(2);

(5) automatic synchronization enable pin i_sync_auto, arranged to receive an automatic synchronization enable signal i_sync_auto, to control the multiplexer circuit 342 by a logic value carried by the automatic synchronization enable signal i_sync_auto, to enable or disable automatic synchronization of the synchronization module 300, wherein multiple candidate logic values 0 and 1 (e.g. 1'b0 and 1'b1) of the logic value may indicate enabling the automatic synchronization and disabling the automatic synchronization, respectively. More particularly, taking the connection method shown in FIG. 1 as an example, if the current stage (i.e. the synchronization module 300) represents the synchronization module SM(0), the logic value may be set as the candidate logic value 0, to control the multiplexer circuit 342 to select the input from the phase selection manual control pin i_phase_sel as the current stage phase relationship detection result signal current_rst; otherwise, the logic value may be set as the candidate logic value 1 to control the multiplexer circuit 342 to select the input from the multiplexer circuit 341 as the current stage phase relationship detection result signal current_rst;

(6) phase selection manual control pin i_phase_sel, arranged to receive a phase selection manual control signal i_phase_sel, to manually control (e.g. mandatorily set) a logic value of the current stage phase relationship detection result signal current_rst by a logic value carried by the phase selection manual control signal i_phase_sel, wherein multiple candidate logic values 0 and 1 (e.g. 1'b0 and 1'b1) of the logic value carried by the phase selection manual control signal i_phase_sel may indicate non-inversion (in phase) and inversion (out of phase), respectively, to control the multiplexer circuit 345 to select a corresponding input for controlling the phase of divided clock output by the synchronized divided output clock pin by2_clk;

(7) synchronization source selection control pin i_sync_source_sel, arranged to receive a synchronization source selection control signal i_sync_source_sel, to automatically control (e.g. automatically set) the logic value of the current stage phase relationship detection result signal current_rst to be equal to a logic value of a data output signal $Q_L$ or a logic value of a data output signal $Q_R$ according to a logic value carried by the synchronization source selection control signal i_sync_source_sel, wherein multiple candidate logic values 0 and 1 (e.g. 1'b0 and 1'b1) of the logic value carried by the synchronization source selection control signal i_sync_source_sel may indicate the left side (e.g. the synchronization source is the left side module) and the right side (e.g. the synchronization source is the right side module), respectively, to control the multiplexer circuit 341 to select a corresponding input (e.g. the data output signal $Q_L$ or the data output signal $Q_R$) as the current stage phase relationship detection result signal current_rst;

(8) synchronized divided output clock pin by2_clk (which may be written as by2_clk(0), by2_clk(1), by2_clk(2), by2_clk($x_0$), by2_clk($x_0$+1), and by2_clk($x_0$+2) in the synchronization modules SM(0), SM(1), SM(2), SM($x_0$), SM($x_0$+1), and SM($x_0$+2), respectively), arranged to output the corresponding input selected by the multiplexer circuit 345, such as the divided clock generated by the divide-by-2 frequency divider 310, to act as a synchronized divided output clock by2_clk, wherein the inverter 344 may perform an inversion operation on the divided clock generated by the divide-by-2 frequency divider 310, to generate the inverted signal; (9) left side divided clock input pin i_sync_left (which may be written as i_sync_left($x_0$), i_sync_left($x_0$+1), and i_sync_left($x_0$+2) in the synchronization modules SM($x_0$), SM($x_0$+1), and SM($x_0$+2), respectively), arranged to receive a left side divided clock input signal i_sync_left from the left side module, to act as an external clock $CLK_{EXTERNAL\_L}$, wherein when the previous stage is located at the left side of the current stage, the previous stage may be regarded as the left side module;

(10) right side divided clock input pin i_sync_right (which may be written as i_sync_right(0), i_sync_right(1), i_sync_right(2), i_sync_right($x_0$), i_sync_right($x_0$+1), and i_sync_right($x_0$+2) in the synchronization modules SM(0), SM(1), SM(2), SM($x_0$), SM($x_0$+1), and SM($x_0$+2), respectively), arranged to receive a right side divided clock input signal i_sync_right from the right side module, to act as an external clock $CLK_{EXTERNAL\_R}$, wherein when the previous stage is located at the right side of the current stage, the previous stage may be regarded as the right side module;

(11) left side divided clock output pin o_sync_left (which may be written as o_sync_left(0), o_sync_left(1), o_sync_left(2), o_sync_left($x_0$), o_sync_left($x_0$+1), and o_sync_left($x_0$+2) in the synchronization modules SM(0), SM(1), SM(2), SM($x_0$), SM($x_0$+1), and SM($x_0$+2), respectively), arranged to output a local clock $CLK_{LOCAL\_L}$ generated by the delay line circuit 320L, to act as a left side divided clock output signal o_sync_left, more particularly, to output the left side divided clock output signal o_sync_left to the left side module by the left side divided clock output pin o_sync_left, wherein the delay line circuit 320L may delay the divided clock generated by the divide-by-2 frequency divider 310, to generate the local clock $CLK_{LOCAL\_L}$, and when the previous stage is located at the left side of the current stage, the previous stage may be regarded as the left side module; and

(12) right side divided clock output pin o_sync_right (which may be written as o_sync_right($x_0$), o_sync_right($x_0$+1), and o_sync_right($x_0$+2) in the synchronization modules SM($x_0$), M($x_0$+1), and SM($x_0$+2), respectively), arranged to output a local clock $CLK_{LOCAL\_R}$ generated by the delay line circuit 320R, to act as a right side divided clock output signal o_sync_right, more particularly, to output the right side divided clock output signal o_sync_right to the right side module by the right side divided clock output pin o_sync_right, wherein the delay line circuit 320R may delay the divided clock generated by the divide-by-2 frequency divider 310, to generate the local clock $CLK_{LOCAL\_R}$, and when the previous stage is located at the right side of the current stage, the previous stage may be regarded as the right side module.

Based on the synchronization result staticizing and automatic configuration control scheme, the electronic device 100 (e.g. the synchronization control circuit therein) may utilize the X synchronization control sub-circuits equipped with the same circuit architecture (e.g. the circuit architecture of the synchronization module 300), such as the X synchronization modules {SM(0) . . . , SM(X−1)}, to automatically synchronize the divided clock phase of the X frequency dividers {DIV(0), . . . , DIV(X−1)}. The synchronization module 300 may utilize the phase relationship detection circuits 330L and 330R to staticize a synchronization result of the current stage with respect to the previous stage, and more particularly, to make the synchronization result become a static signal, which facilitates the timing closure in digital. In addition, the electronic device 100 (e.g. the synchronization control circuit therein) may eliminate the need for a synchronized reset signal for the X frequency dividers {DIV(0), . . . , DIV(X−1)}. The electronic device 100 (e.g. the synchronization control circuit therein) is equipped with programmable architecture applicable to different scenarios. As a result, when there is a need, the electronic device 100 (e.g. the synchronization control circuit therein) may be flexibly extended infinitely.

Take the connection topology shown in FIG. 2 as an example. In this configuration, the synchronization module SM(0) located in the command/address physical layer circuit APHY may be regarded as a master module, and the synchronization modules SM(1), SM(2), . . . , located in the data physical layer circuits DPHY(1), DPHY(2), . . . may be regarded as slave modules, wherein the phase information may be propagated from the synchronization module SM(0) to all of the subsequent synchronization modules SM(1), SM(2), . . . . As a result, the operations of the data physical layer circuits DPHY(1), DPHY(2), . . . may be automatically synchronized to the operation of the command/address physical layer circuit APHY. After the automatic synchronization, respective synchronized divided output clocks by2_clk(0), by2_clk(1), by2_clk(2), . . . of the synchronization modules SM(0), SM(1), SM(2), . . . will be non-inverted/in phase.

Take the connection topology shown in FIG. 1 as another example. In this configuration, the synchronization module SM(0) located in the physical layer circuit PHY(0) may be regarded as the master module, and the synchronization modules SM(1), SM(2), . . . located in the physical layer circuits PHY(1), PHY(2), . . . may be regarded as the slave modules, wherein the phase information may be propagated from the synchronization module SM(0) to all of the subsequent synchronization modules SM(1), SM(2), a result, the operations of the physical layer circuits PHY(1), PHY (2), . . . may be automatically synchronized to the operation of the physical layer circuit PHY(0). After the automatic synchronization, respective synchronized divided output clocks by2_clk(0), by2_clk(1), by2_clk(2), . . . of the synchronization modules SM(0), SM(1), SM(2), . . . will be non-inverted/in phase.

In a system with a single source clock, all of the divided clocks in the multiple divided clocks of the single source clock should be synchronized with each other, without any phase errors, to allow all of the operations to be performed normally (as required by the original circuit design). As a result, operating the electronic device 100 (e.g. the synchronization control circuit therein) based on the synchronization result staticizing and automatic configuration control scheme can ensure correctness of all functions of the electronic device 100. In addition, when the system belongs to a newer application, it may become more difficult to design a synchronization reset signal for the multiple frequency dividers that are arranged to generate the multiple divided clocks, for example, because of the high frequency and the on-chip variation (OCV). Implementing the electronic device 100 (e.g. the synchronization control circuit therein) based on the synchronization result staticizing and automatic configuration control scheme can ensure the electronic device 100 to avoid this problem, and more particularly, to be applicable to various high frequency applications.

The related details regarding the multiple candidate logic values 0 and 1 (e.g. 1′b0 and 1′b1) of the logic value carried by the synchronization source selection control signal i_sync_source_sel may be further illustrated as follows. The above-mentioned synchronization source may represent the above-mentioned previous stage (e.g. the left side module or the right side module). When the synchronization source selection control signal i_sync_source_sel is configured to carry the candidate logic value 0, to indicate the left side (e.g. the synchronization source is the left side module) for controlling the multiplexer circuit 341 to select the corresponding input (e.g. the data output signal $Q_L$) as the current stage phase relationship detection result signal current_rst, the left side divided clock input pin i_sync_left may be configured to receive the left side divided clock signal i_sync_left from the left side module as the external clock $CLK_{EXTERNAL\_L}$. In addition, the phase relationship detection circuit 330L may utilize the delay circuit 331L to delay the external clock $CLK_{EXTERNAL\_L}$, to generate a delayed external clock $CLK_{EXTERNAL\_L}$ as the data input signal $D_L$, and utilize the D-type flip-flop 332L to sample the external clock $CLK_{EXTERNAL\_L}$ according to the local clock $CLK_{LOCAL\_L}$, to generate the data output signal $Q_L$ as a first staticizing synchronization result corresponding to the phase relationship detection circuit 330L, for the use in phase control regarding the synchronized divided output clock by2_clk performed by the configurable phase control circuit 340 (e.g. the XOR gate 343).

When the synchronization source selection control signal i_sync_source_sel is configured to carry the candidate logic value 1, to indicate the right side (e.g. the synchronization source is the right side module) for controlling the multiplexer circuit 341 to select the corresponding input (e.g. the data output signal $Q_R$) as the current stage phase relationship detection result signal current_rst, the right side divided clock input pin i_sync_right may be configured to receive the right side divided clock signal i_sync_right from the right side module as the external clock $CLK_{EXTERNAL\_R}$ In addition, the phase relationship detection circuit 330R may utilize the delay circuit 331R to delay the external clock $CLK_{EXTERNAL\_R}$, to generate a delayed external clock $CLK_{EXTERNAL\_R}$ as the data input signal DR, and utilize the D-type flip-flop 332R to sample the external clock $CLK_{EXTERNAL\_R}$ according to the local clock $CLK_{LOCAL\_R}$, to generate the data output signal $Q_R$ as a second staticizing synchronization result corresponding to the phase relationship detection circuit 330R, for the use in phase control regarding the synchronized divided output clock by2_clk performing by the configurable phase control circuit 340 (e.g. the XOR gate 343).

Figure 4:
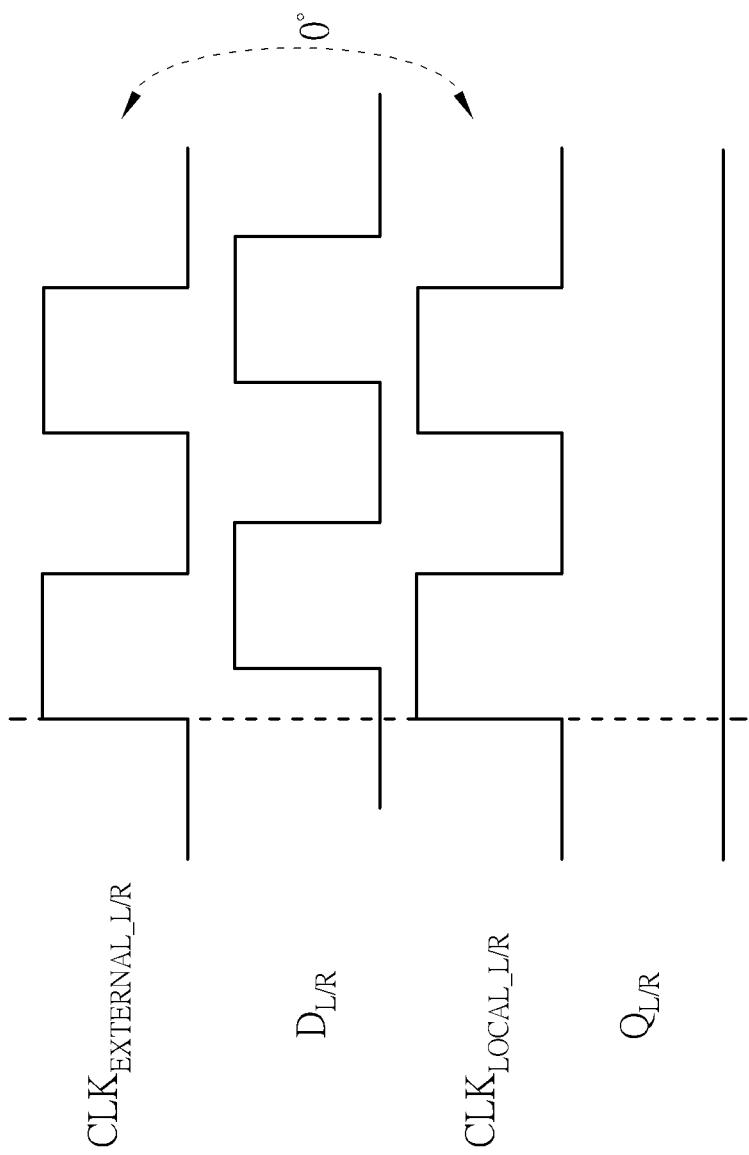
FIG. 4 is a diagram illustrating a non-inversion/in-phase detection result involved in the synchronization result staticizing and automatic configuration control scheme shown in FIG. 3 according to an embodiment of the present invention.

FIG. 4 is a diagram illustrating a non-inversion/in-phase detection result involved in the synchronization result staticizing and automatic configuration control scheme shown in FIG. 3 according to an embodiment of the present invention. Regarding the phase relationship detection circuit 330L, the external clock $CLK_{EXTERNAL\_L/R}$, the local clock $CLK_{LOCAL\_L/R}$, the data input signal $D_{L/R}$, and the data output signal $Q_{L/R}$ may represent the external clock $CLK_{EXTERNAL\_L}$, the local clock $CLK_{LOCAL\_L}$, the data input signal $D_L$, and the data output signal $Q_L$, respectively. Regarding the phase relationship detection circuit 330R, the external clock $CLK_{EXTERNAL\_L/R}$, the local clock $CLK_{LOCAL\_L/R}$, the data input signal $D_{L/R}$, and the data output signal $Q_{L/R}$ may represent the external clock $CLK_{EXTERNAL\_R}$, the local clock $CLK_{LOCAL\_R}$, the data input signal DR, and the data output signal $Q_R$, respectively.

For example, the phase relationship detection circuit 330L may utilize the delay circuit 331L to delay the external clock $CLK_{EXTERNAL\_L}$, to generate the data input signal $D_L$, so that the D-type flip-flop 332L may correctly sample the external clock $CLK_{EXTERNAL\_L}$ according to the local clock $CLK_{LOCAL\_L}$, to generate the data output signal $Q_L$, and may avoid any sampling operations performed on any state transition edge of the external clock $CLK_{EXTERNAL\_L}$, to ensure the correctness of the first staticizing synchronization result. Since the phase relationship between the external clock $CLK_{EXTERNAL\_L}$ and the local clock $CLK_{LOCAL\_L}$ is non-inversion/in-phase (for brevity, labeled as "0°"), the data output signal $Q_L$ may carry a second predetermined logic value, such as the candidate logic value 0 (e.g. 1′b0; which may be illustrated as a low voltage level in FIG. 4), to indicate that the first staticizing synchronization result represents the non-inversion/in-phase detection result.

For another example, the phase relationship detection circuit 330R may utilize the delay circuit 331R to delay the external clock $CLK_{EXTERNAL\_R}$, to generate the data input signal DR, so that the D-type flip-flop 332R may correctly sample the external clock $CLK_{EXTERNAL\_R}$ according to the local clock $CLK_{LOCAL\_R}$, to generate the data output signal $Q_R$, and may avoid any sampling operations performed on any state transition edge of the external clock $CLK_{EXTERNAL\_R}$, to ensure the correctness of the second staticizing synchronization result. Since the phase relationship between the external clock $CLK_{EXTERNAL\_R}$ and the local clock $CLK_{LOCAL\_R}$ is non-inversion/in-phase (for brevity, labeled as "0°"), the data output signal $Q_R$ may carry the second predetermined logic value, such as the candidate logic value 0 (e.g. 1'b0; which may be illustrated as the low voltage level in FIG. 4), to indicate that the second staticizing synchronization result represents the non-inversion/in-phase detection result. For brevity, similar descriptions for this embodiment are not repeated in detail here.

Figure 5:
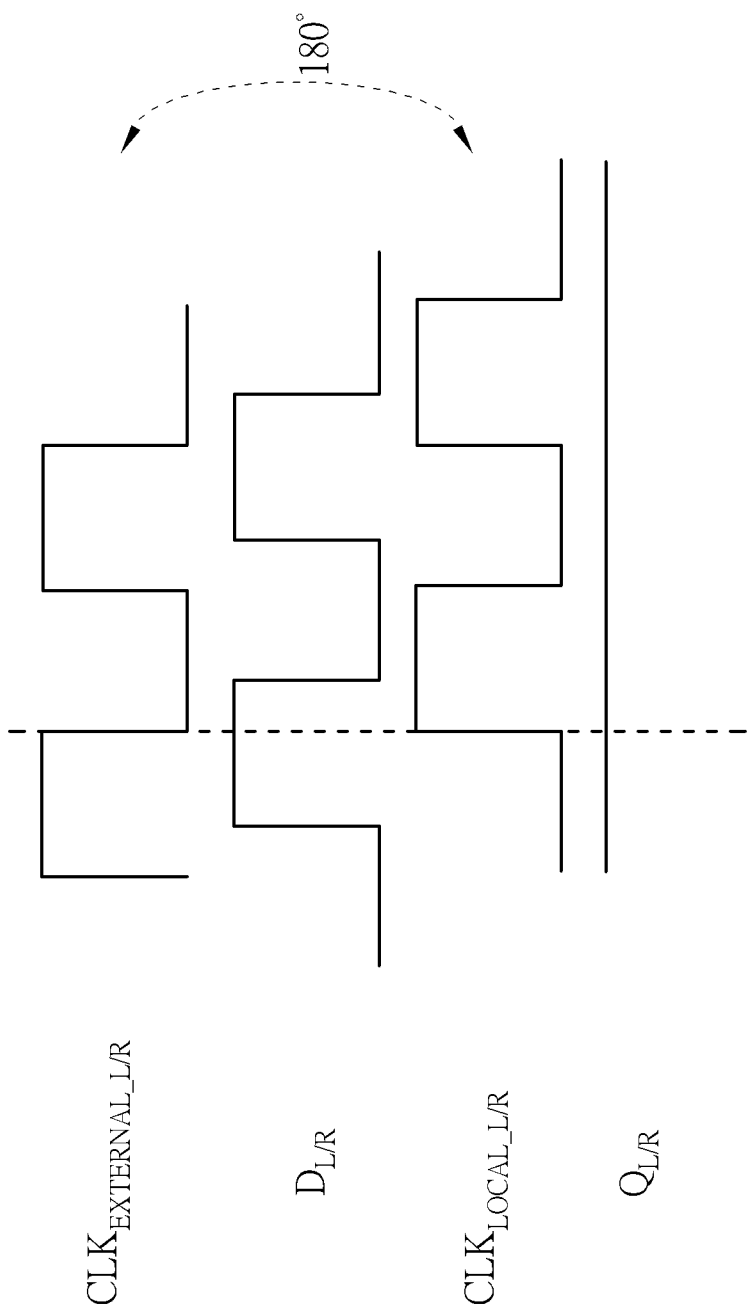
FIG. 5 is a diagram illustrating an inversion/out-of-phase detection result involved in the synchronization result staticizing and automatic configuration control scheme shown in FIG. 3 according to an embodiment of the present invention.

FIG. 5 is a diagram illustrating an inversion/out-of-phase detection result involved in the synchronization result staticizing and automatic configuration control scheme shown in FIG. 3 according to an embodiment of the present invention. For example, the phase relationship detection circuit 330L may utilize the delay circuit 331L to delay the external clock $CLK_{EXTERNAL\_L}$, to generate the data input signal $D_L$, so that the D-type flip-flop 332L may correctly sample the external clock $CLK_{EXTERNAL\_L}$ according to the local clock $CLK_{LOCAL\_L}$, to generate the data output signal $Q_L$, and may avoid any sampling operations performed on any state transition edge of the external clock $CLK_{EXTERNAL\_L}$, to ensure the correctness of the first staticizing synchronization result. Since the phase relationship between the external clock $CLK_{EXTERNAL\_L}$ and the local clock $CLK_{LOCAL\_L}$ is inversion/out-of-phase (for brevity, labeled as "180°"), the data output signal $Q_L$ may carry a first predetermined logic value, such as the candidate logic value 1 (e.g. 1'b1; which may be illustrated as a high voltage level in FIG. 5), to indicate that the first staticizing synchronization result represents the inversion/out-of-phase detection result.

For another example, the phase relationship detection circuit 330R may utilize the delay circuit 331R to delay the external clock $CLK_{EXTERNAL\_R}$ to generate the data input signal DR, so that the D-type flip-flop 332R may correctly sample the external clock $CLK_{EXTERNAL\_R}$ according to the local clock $CLK_{LOCAL\_R}$, to generate the data output signal $Q_R$, and may avoid any sampling operations performed on any state transition edge of the external clock $CLK_{EXTERNAL\_R}$, to ensure the correctness of the second staticizing synchronization result. Since the phase relationship between the external clock $CLK_{EXTERNAL\_R}$ and the local clock $CLK_{LOCAL\_R}$ is inversion/out-of-phase (for brevity, labeled as "180°"), the data output signal $Q_R$ may carry the first predetermined logic value, such as the candidate logic value 1 (e.g. 1'b1; which may be illustrated as a high voltage level in FIG. 5), to indicate that the second staticizing synchronization result represents the inversion/out-of-phase detection result. For brevity, similar descriptions for this embodiment are not repeated in detail here.

Figure 6:
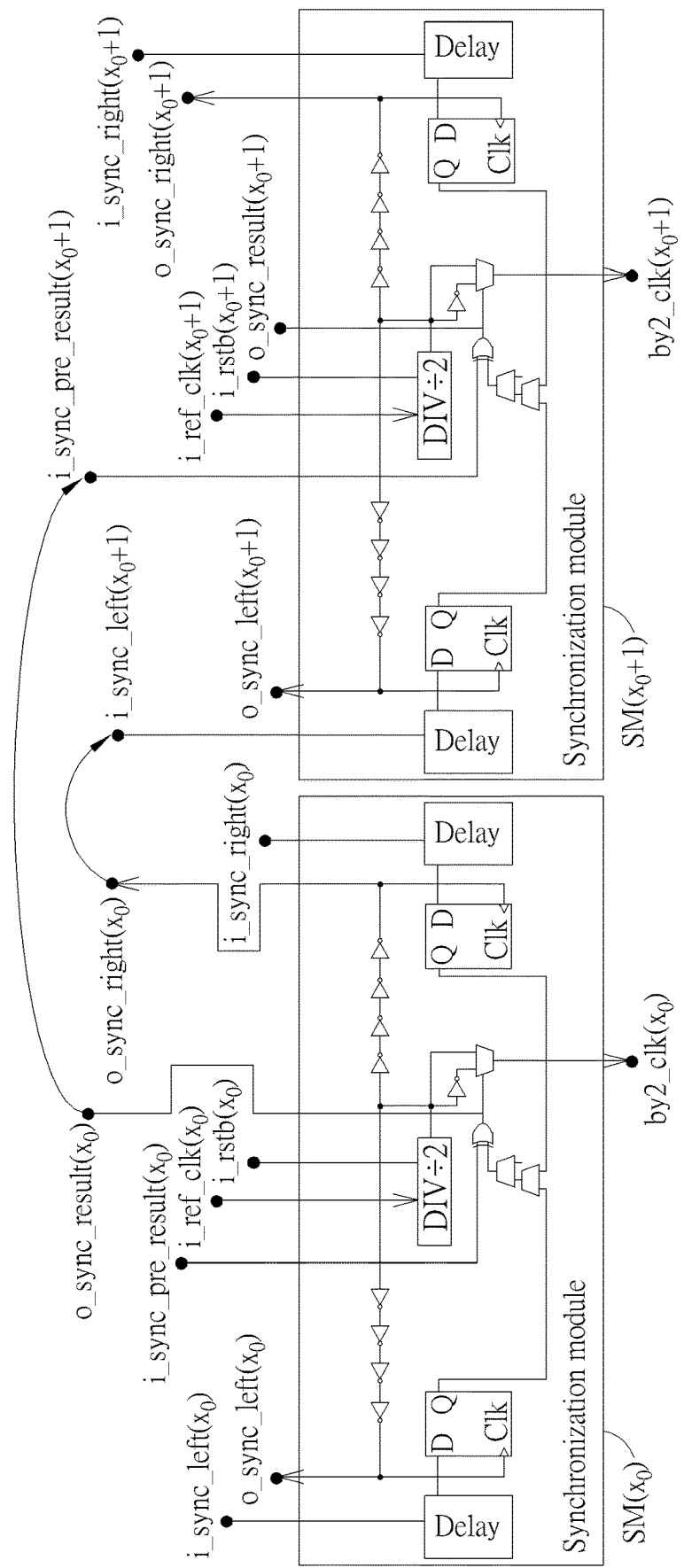
FIG. 6 is a diagram illustrating a first configurable synchronization line control scheme according to an embodiment of the present invention.

FIG. 6 is a diagram illustrating a first configurable synchronization line control scheme according to an embodiment of the present invention. For better comprehension, an $x^{th}$ synchronization control sub-circuit in the X synchronization control sub-circuits may represent an $x^{th}$ synchronization module SM(x) in the X synchronization modules {SM(0), . . . , SM(X−1)}, such as the synchronization module 300, wherein the index x may represent any integer in an interval [0, (X−1)]. For example, when $x=x_0$ (e.g. the symbol "$x_0$" may represent any integer in an interval [0, (X−2)]), the $x^{th}$ synchronization module SM(x), such as the synchronization module 300, may be illustrated as a synchronization module SM($x_0$) shown in the left half of FIG. 6. For another example, when $x=(x_0+1)$, the $x^{th}$ synchronization module SM(x), such as the synchronization module 300, may be illustrated as a synchronization module SM($x_0$+1) shown in the right half of FIG. 6. In addition, the X synchronization control sub-circuits, such as the X synchronization modules {SM(0), . . . , SM(X−1)}, may be configured as a synchronization line circuit, so that the $x_0^{th}$ and $(x_0+1)^{th}$ synchronization control sub-circuits in the X synchronization control sub-circuits, such as the $x_0^{th}$ synchronization module SM($x_0$) and the $(x_0+1)^{th}$ synchronization module SM($x_0$+1), may perform signal exchange in a manner shown in FIG. 6. More particularly, a left side divided clock input pin i_sync_left($x_0$+1) and a previous stage phase selection result input pin i_sync_pre_result($x_0$+1) of the synchronization module SM($x_0$+1) may be coupled to a right side divided clock output pin o_sync_right($x_0$) and a current stage phase selection result output pin o_sync_result($x_0$) of the synchronization module SM($x_0$), respectively. For brevity, similar descriptions for this embodiment are not repeated in detail here.

In the configuration shown in FIG. 6, the synchronization module SM($x_0$) and the synchronization module SM($x_0$+1) may be regarded as examples of the previous stage and the current stage in the X synchronization control sub-circuits, such as the X synchronization modules {SM(0), . . . , SM(X−1)}, respectively, and may also be regarded as examples of the current stage and the next stage in the X synchronization control sub-circuits, such as the X synchronization modules {SM(0), . . . , SM(X−1)}, respectively, wherein the synchronization module SM($x_0$) and the synchronization module SM($x_0$+1) may be regarded as the left side module of the synchronization module SM($x_{0+1}$) and the right side module of the synchronization module SM($x_0$), but the present invention is not limited thereto. In some embodiments, the relative position of the synchronization modules SM($x_0$) and SM($x_0$+1) may vary, and/or related connection (along with related signal exchange) of the synchronization modules SM($x_0$) and SM($x_0$+1) may vary. For brevity, similar descriptions for these embodiments are not repeated in detail here.

Figure 7:
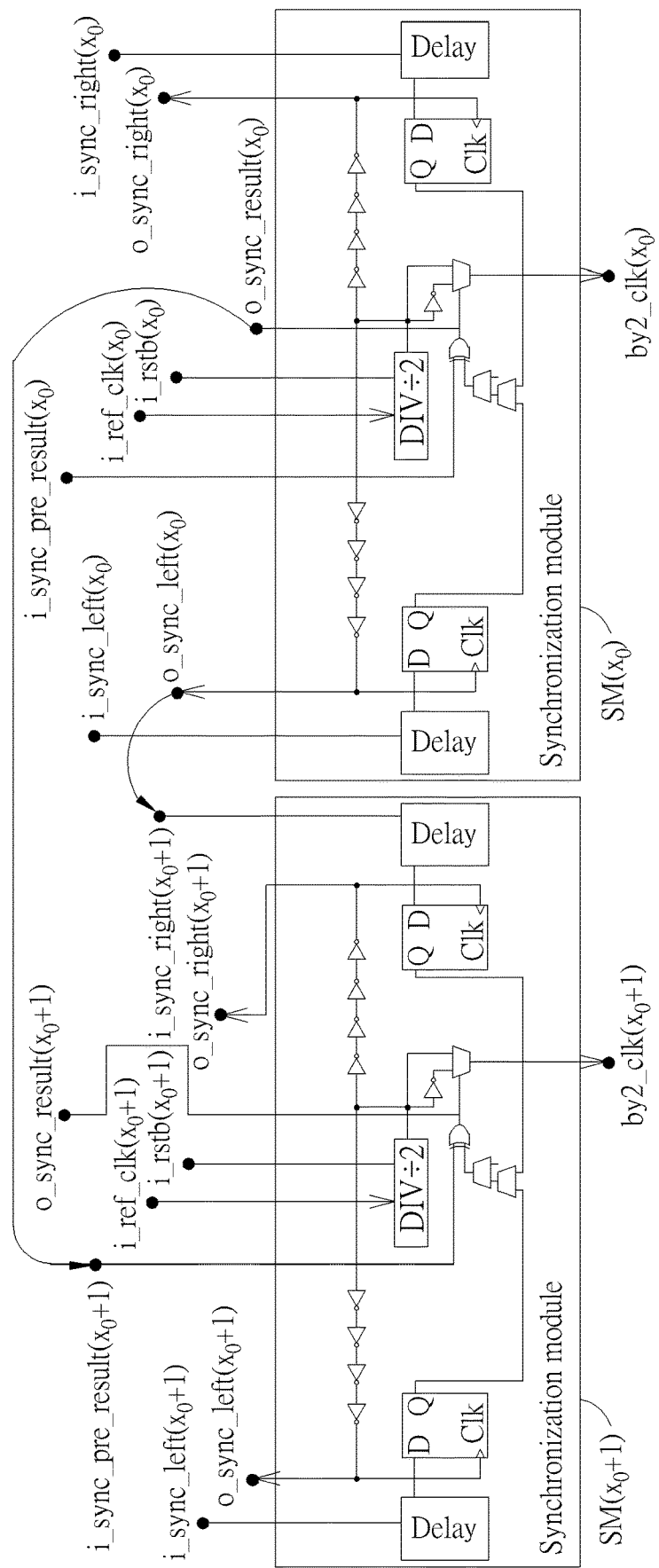
FIG. 7 is a diagram illustrating a second configurable synchronization line control scheme according to an embodiment of the present invention.

FIG. 7 is a diagram illustrating a second configurable synchronization line control scheme according to an embodiment of the present invention. According to the embodiment, respective positions of the synchronization modules SM($x_0$) and SM($x_0$+1) shown in FIG. 6 may be swapped, so that the synchronization module SM($x_0$) and the synchronization module SM($x_0$+1) may be located at the right half and the left half of FIG. 7, respectively, and the connection between the synchronization modules SM($x_0$) and SM($x_0$+1) may be reconfigured. More particularly, a right side divided clock input pin i_sync_right($x_0$+1) and a previous stage phase selection result input pin i_sync_pre_result($x_0$+1) of the synchronization module SM($x_0$+1) may be coupled to a left side divided clock output pin o_sync_left($x_0$) and a current stage phase selection result output pin o_sync_result($x_0$) of the synchronization module SM($x_0$), respectively. In addition, the $x_0^{th}$ synchronization control sub-circuit and the $(x_0+1)^{th}$ synchronization control sub-circuit in the X synchronization control sub-circuits, such as the $x_0^{th}$ synchronization module SM($x_0$) and the ($x_0$+1)th synchronization module SM SM($x_0$+1), may perform signal exchange in a manner similar to that between respective synchronization sub-circuits (e.g. the synchronization modules SM(0) and SM(1)) of the physical layer circuits PHY(0) and PHY(1), or respective synchronization sub-circuits (e.g. the synchronization modules SM(1) and SM(2)) of the physical layer circuits PHY(1) and PHY(2). For brevity, similar descriptions for this embodiment are not repeated in detail here.

Figure 8:
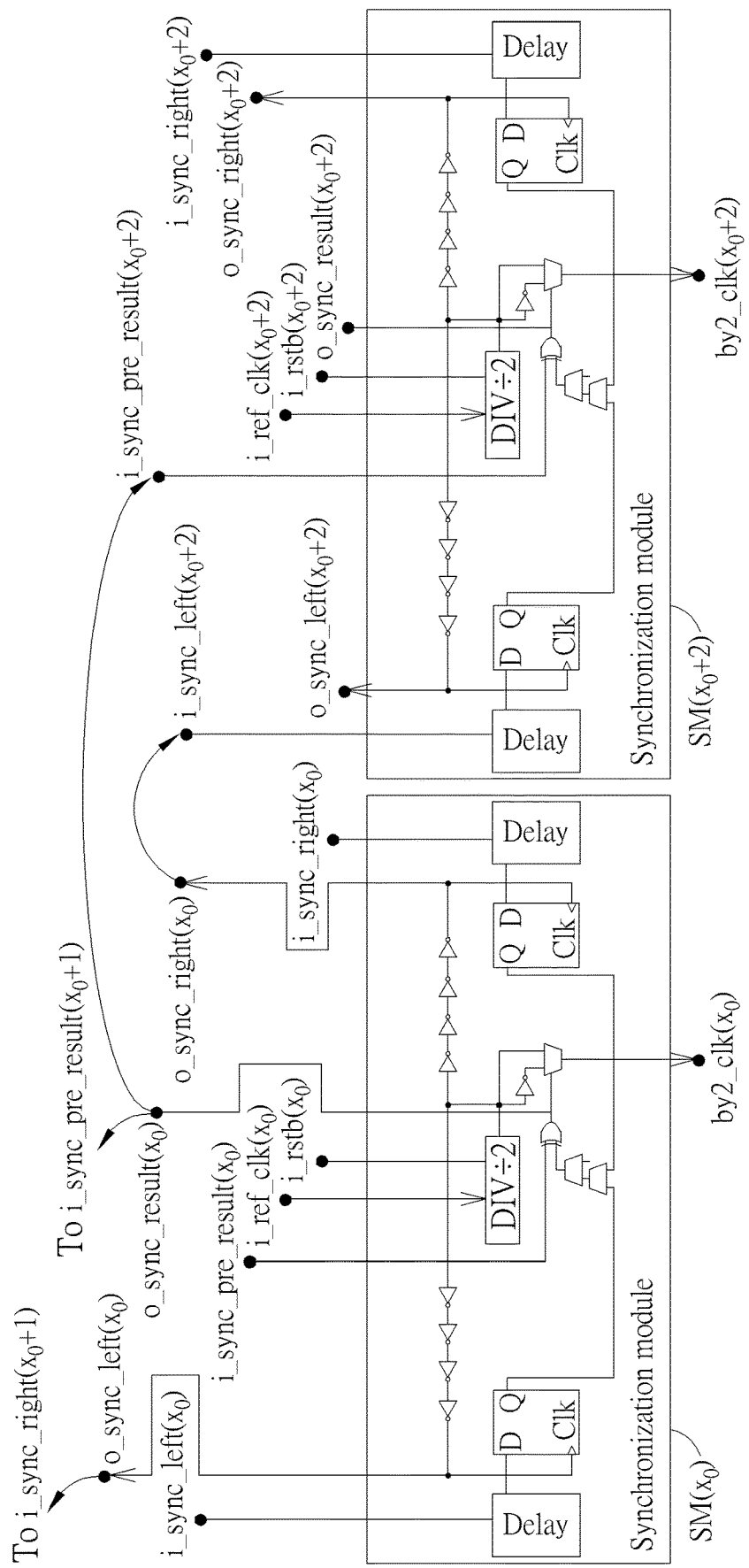
FIG. 8 is a diagram illustrating a third configurable synchronization line control scheme according to an embodiment of the present invention.

FIG. 8 is a diagram illustrating a third configurable synchronization line control scheme according to an embodiment of the present invention. According to the embodiment, the X synchronization control sub-circuits, such as the X synchronization modules {SM(0), . . . , SM(X-1)}, may be configured as a tree synchronization line circuit equipped with a tree structure, wherein the synchronization module SM($x_0$) may be regarded as a node in the tree structure, and the synchronization modules SM($x_0$+1) and SM($x_0$+2) may be regarded as two branches starting from the node, but the present invention is not limited thereto. In some embodiments, the relative position of the synchronization modules SM($x_0$), SM($x_0$+1), and SM($x_0$+2) may vary, and/or related connection (along with related signal exchange) of the synchronization modules may vary.

Regarding the third configurable synchronization line control scheme, please refer to FIG. 7 and FIG. 8 at the same time for better comprehension. It is assumed that the symbol "$x_0$" may represent any integer in an interval [0, (X-3)]. For example:

(1) when x=$x_0$, the $x^{th}$ synchronization module SM(x), such as the synchronization module 300, may be illustrated as the synchronization module SM($x_0$) shown in the left half of FIG. 8, and may also be illustrated the synchronization module SM($x_0$) shown in the right half of FIG. 7;

(2) when x=($x_0$+1), the $x^{th}$ synchronization module SM(x), such as the synchronization module 300, may be illustrated as the synchronization module SM($x_0$+1) shown in the left half of FIG. 7; (3) when x=($x_0$+2), the $x^{th}$ synchronization module SM(x), such as the synchronization module 300, may be illustrated as the synchronization module SM($x_0$+2) shown in the right half of FIG. 8. In addition, the $x_0$th and ($x_0$+1)th synchronization control sub-circuits in the X synchronization control sub-circuits, such as the $x_0^{th}$ synchronization module SM($x_0$) and the ($x_0$+1)$^{th}$ synchronization module SM($x_0$+1), may perform signal exchange in a manner shown in FIG. 7, wherein the left side divided clock output pin o_sync_left($x_0$) and the current stage phase selection result output pin o_sync_result($x_0$) of the synchronization module SM($x_0$) may be coupled to the right side divided clock input pin i_sync_right($x_0$+1) and the previous phase selection result input pin i_sync_pre_result($x_{0+1}$) of the synchronization module SM($x_0$+1), respectively (for brevity, labeled as "To i_sync_right($x_0$+1)" and "To i_sync_pre_result($x_0$+1)" in FIG. 8). In addition, the $x_0$th and ($x_0$+2)th synchronization control sub-circuits in the X synchronization control sub-circuits, such as the $x_0$th synchronization module SM($x_0$) and the ($x_0$+2)$^{th}$ synchronization module SM($x_0$+2), may perform signal exchange in a manner shown in FIG. 8. More particularly, the left side divided clock input pin i_sync_left($x_0$+2) and the previous stage phase selection result input pin i_sync_pre_result($x_0$+2) of the synchronization module SM($x_0$+2) may be coupled to the right side divided clock output pin o_sync_right ($x_0$) and the current stage phase selection result output pin o_sync_result($x_0$) of the synchronization module SM($x_0$), respectively. For brevity, similar descriptions for this embodiment are not repeated in detail here.

According to some embodiments, the synchronization modules SM($x_0$) and SM($x_0$+1) may be rearranged to be located at the top half and the bottom half of FIG. 6, respectively, or may be rearranged to be located at the bottom half and the top half of FIG. 6, respectively. In addition, the connection between the synchronization modules SM($x_0$) and SM($x_0$+1) may be reconfigured selectively, wherein whether reconfiguration is required may be determined according to the optimized routing of the synchronization modules SM($x_0$), SM($x_0$+1), and/or one or more other synchronization modules. For example:

(1) when the reconfiguration is not required, the left side divided clock input pin i_sync_left($x_0$+1) and the previous stage phase selection result input pin i_sync_pre_result($x_0$+1) of the synchronization module SM($x_0$+1) may be coupled to the right side divided clock output pin o_sync_right ($x_0$) and the current stage phase selection result output pin o_sync_result($x_0$) of the synchronization module SM($x_0$), respectively; and (2) when the reconfiguration is required, the right side divided clock input pin i_sync_right($x_0$+1) and the previous phase selection result input pin i_sync_pre_result($x_0$+1) of the synchronization module SM($x_0$+1) may be coupled to the left side divided clock output pin o_sync_left($x_0$) and the current stage phase selection result output pin o_sync_result ($x_0$) of the synchronization module SM($x_0$), respectively.

For brevity, similar descriptions for these embodiments are not repeated in detail here.

TABLE 2

| Physical layer circuit | PHY(0) | PHY(1) | PHY(2) | PHY(3) | PHY (4) | PHY(5) |
|---|---|---|---|---|---|---|
| Phase of the output of frequency divider | 0° | 180° | 0° | 0° | 180° | 180° |
| current_rst | 1'b0 (fixed) | 1'b1 | 1'b1 | 1'b0 | 1'b1 | 1'b1 |
| o_sync_result | 1'b0 (fixed) | 1'b1 | 1'b0 | 1'b0 | 1'b1 | 1'b1 |
| Phase of by2_clk | 0° | 0° | 0° | 0° | 0° | 0° |

Table 2 illustrates phases of respective outputs (e.g. divided clocks) of the X frequency dividers {DIV(0), . . . , DIV(X-1)} of the X synchronization modules {SM(0), . . . , SM(X-1)} of the X physical layer circuits {PHY(0), . . . , PHY(X-1)} (e.g. the physical layer circuits PHY(0), PHY(1), PHY(2), PHY(3), PHY(4), and PHY(5)), and the logic values or phases of related signals (e.g. the current stage phase relationship detection result signal current_rst, the current stage phase selection result output signal o_sync_result, and the synchronized divided output clock by2_clk) according to an embodiment of the present invention. For example, the X synchronization control sub-circuits, such as the X synchronization modules {SM(0), . . . , SM(X-1)}, may be configured as the synchronization line circuit, and the above-mentioned any two adjacent synchronization modules SM($x_0$) and SM($x_0$+1) may perform the signal exchange in the manner shown in FIG. 6 or FIG. 7.

Based on the synchronization staticizing and automatic configuration control scheme, no matter which possible combination that the combination of phases of these outputs (e.g. divided clocks) of the frequency dividers {DIV(0), . . . , DIV(X-1)} of the X physical layer circuits {PHY(0), . . . , PHY(X-1)} is equal to, the phase information may be propagated from the synchronization module SM(0) to all of the subsequent synchronization modules SM(1), SM(2), to allow the operations of the physical layer circuits PHY(1), PHY(2), . . . , to be automatically synchronized to the operation of the physical layer circuit PHY(0). After the automatic synchronization, respective synchronized divided output clocks by2_clk(0), by2_clk(1), by2_clk(2), . . . of the synchronization modules SM(0), SM(1), SM(2), . . . will be non-inverted/in phase. For brevity, similar descriptions for this embodiment are not repeated in detail here.

TABLE 3

| Physical layer circuit | PHY(0) | PHY(1) | PHY(2) | PHY(3) | PHY(4) | PHY(5) |
|---|---|---|---|---|---|---|
| Phase of the output of frequency divider | 180° | 180° | 0° | 0° | 180° | 180° |
| current_rst | 1'b0 (fixed) | 1'b0 | 1'b1 | 1'b0 | 1'b1 | 1'b0 |
| o_sync_result | 1'b0 (fixed) | 1'b0 | 1'b1 | 1'b1 | 1'b0 | 1'b0 |
| Phase of by2_clk | 180° | 180° | 180° | 180° | 180° | 180° |

Table 3 illustrates phases of respective outputs (e.g. divided clocks) of the X frequency dividers {DIV(0), . . . , DIV(X-1)} of the X synchronization modules {SM(0), . . . , SM(X-1)} of the X physical layer circuits {PHY(0), . . . , PHY(X-1)} (e.g. the physical layer circuits PHY(0), PHY(1), PHY(2), PHY(3), PHY(4), and PHY(5)), and the logic value or phase of related signals (e.g. the current stage phase relationship detection result signal current_rst, the current stage phase selection result output signal o_sync_result, and the synchronized divided output clock by2_clk) according to another embodiment of the present invention. For example, the X synchronization control sub-circuits, such as the X synchronization modules {SM(0), . . . , SM(X-1)}, may be configured as the synchronization line circuit, and the above-mentioned any two adjacent synchronization modules $SM(x_0)$ and $SM(x_0+1)$ may perform the signal exchange by the manner shown in FIG. 6 or FIG. 7.

Based on the synchronization staticizing and automatic configuration control scheme, no matter which possible combination that the combination of phases of these outputs (e.g. divided clocks) of the frequency dividers {DIV(0), . . . , DIV(X-1)} of the X physical layer circuits {PHY(0), . . . , PHY(X-1)} is equal to, the phase information can be propagated from the synchronization module SM(0) to all of the subsequent synchronization modules SM(1), SM(2), for allowing the operations of the physical layer circuits PHY(1), PHY(2), . . . , to be automatically synchronized to the operation of the physical layer circuit PHY(0). After the automatic synchronization, respective synchronized divided output clocks by2_clk(0), by2_clk(1), by2_clk(2), . . . of the synchronization modules SM(0), SM(1), SM(2), . . . will be non-inverted/in phase. For brevity, similar descriptions for this embodiment are not repeated in detail here.

Figure 9:
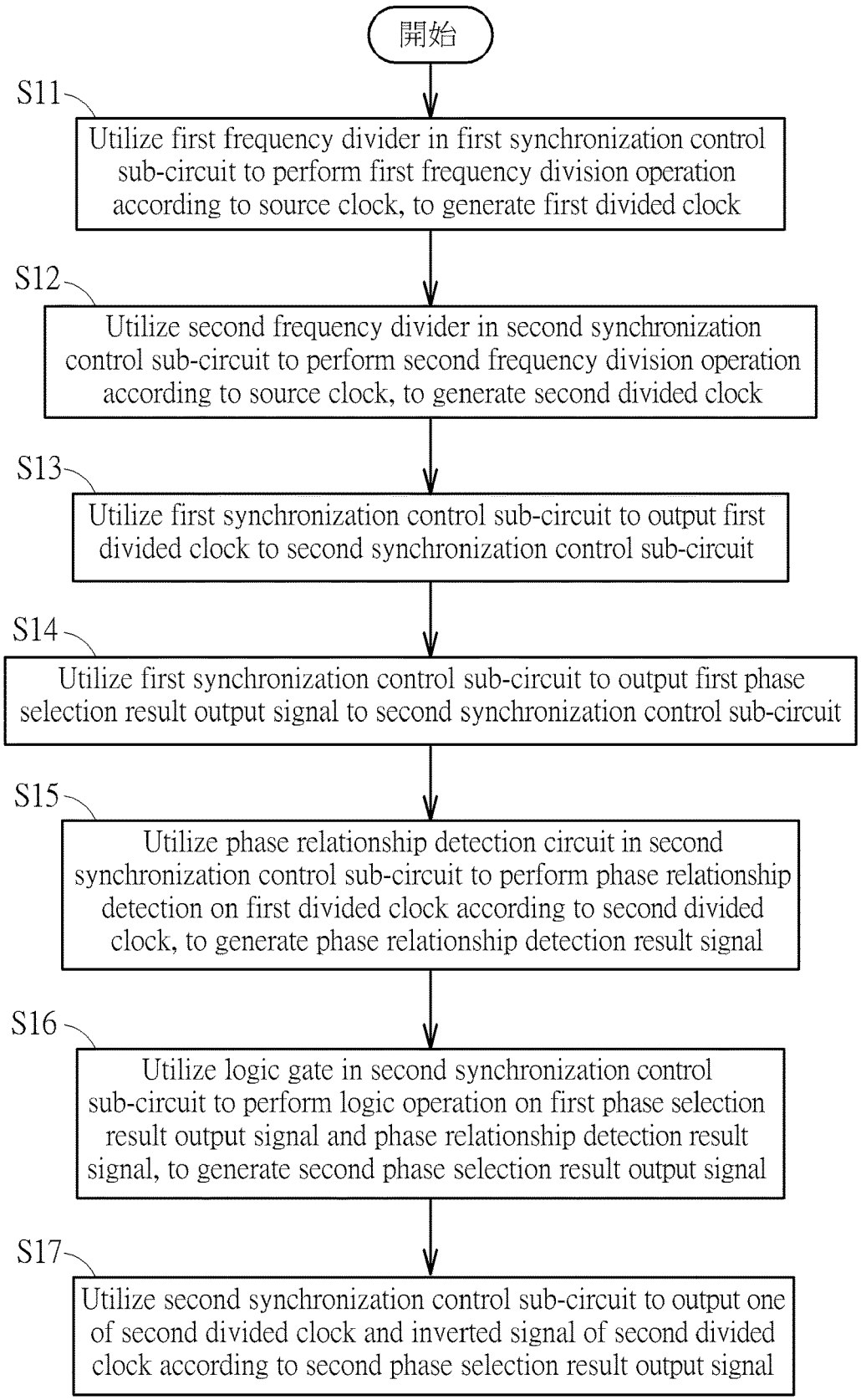
FIG. 9 is a work flow of the method according to an embodiment of the present invention.

FIG. 9 is a work flow of the method according to an embodiment of the present invention. The method may be applicable to the electronic device 100 and the synchronization control circuit therein, and more particularly, may be applicable to the X synchronization control sub-circuits, such as the X synchronization modules {SM(0), . . . , SM(X-1)} (e.g. the synchronization module 300 shown in FIG. 3). In the X synchronization control sub-circuits (e.g. the X synchronization modules {SM(0), . . . , SM(X-1)}), a first synchronization control sub-circuit and a second synchronization control sub-circuit may represent the synchronization modules $SM(x_0)$ and $SM(x_0+1)$, respectively.

In Step S11, the electronic device 100 (e.g. the synchronization control circuit) may utilize a first frequency divider (e.g. the frequency divider $DIV(x_0)$) in the first synchronization control sub-circuit (e.g. the synchronization module $SM(x_0)$) to perform a first frequency division operation according to the source clock $CLK_{SOURCE}$, to generate a first divided clock, such as the divided clock generated by the divide-by-2 frequency divider 310 in the synchronization module $SM(x_0)$.

In Step S12, the electronic device 100 (e.g. the synchronization control circuit) may utilize a second frequency divider (e.g. the frequency divider $DIV(x_0+1)$) in the second synchronization control sub-circuit (e.g. the synchronization module $SM(x_0+1)$) to perform a second frequency division operation according to the source clock $CLK_{SOURCE}$, to generate a second divided clock, such as the divided clock generated by the divide-by-2 frequency divider 310 in the synchronization module $SM(x_0+1)$.

In Step S13, the electronic device 100 (e.g. the synchronization control circuit) may utilize the first synchronization control sub-circuit (e.g. the synchronization module $SM(x_0)$) to output the first divided clock to the second synchronization control sub-circuit (e.g. the synchronization module $SM(x_0+1)$), and more particularly, to output a delay version of the first divided clock (e.g. the local clock $CLK_{LOCAL\_L}/R$ in the synchronization module $SM(x_0)$) to the second synchronization control sub-circuit (e.g. the synchronization module $SM(x_0+1)$). For example, the electronic device 100 (e.g. the synchronization control circuit) may output the local clock $CLK_{LOCAL\_L}$ in the synchronization module $SM(x_0)$ to the synchronization module $SM(x_0+1)$ through the left side divided clock output pin o_sync_left($x_0$) of the synchronization module $SM(x_0)$. For another example, the electronic device 100 (e.g. the synchronization control circuit) may output the local clock $CLK_{LOCAL\_R}$ in the synchronization module $SM(x_0)$ to the synchronization module $SM(x_0+1)$ through the right side divided clock output pin o_sync_right($x_0$) of the synchronization module $SM(x_0)$.

In Step S14, the electronic device 100 (e.g. the synchronization control circuit) may utilize the first synchronization control sub-circuit (e.g. the synchronization module $SM(x_0)$) to output a first phase selection result output signal, such as the current stage phase selection result output signal o_sync_result($x_0$) to the second synchronization control sub-circuit (e.g. the synchronization module $SM(x_0+1)$), and more particularly, to output the current stage phase selection result output signal o_sync_result($x_0$) to the synchronization module $SM(x_0+1)$ through the current stage phase selection result output pin o_sync_result($x_0$) of the synchronization module $SM(x_0)$, to act as the previous stage phase selection result input signal i_sync_pre_result($x_0+1$) received by the previous stage phase selection result input pin i_sync_pre_result($x_0+1$) of the synchronization module $SM(x_0+1)$, wherein the logic value carried by the first phase selection result output signal may indicate a first phase selection result of the first synchronization control sub-circuit (e.g. the synchronization module $SM(x_0)$).

In Step S15, the electronic device 100 (e.g. the synchronization control circuit) may utilize a phase relationship detection circuit in the second synchronization control sub-circuit, such as the phase relationship detection circuit 330L or the phase relationship detection circuit 330R in the synchronization module SM($x_0$+1), to perform phase relationship detection on the first divided clock (e.g. the delay version of the first divided clock, such as the local clock $CLK_{LOCAL\_L}$/R in the synchronization module SM($x_0$)) according to the second divided clock (e.g. the delay version of the second divided clock, such as the local clock $CLK_{LOCAL\_L}$/R in the synchronization module SM($x_0$+1)), to generate a phase relationship detection result signal (e.g. the current stage phase relationship detection result signal current_rst in the synchronization module SM($x_0$+1)), wherein the logic value carried by the phase relationship detection result signal may indicate a phase relationship detection result of the second synchronization control sub-circuit (e.g. the synchronization module SM($x_0$+1)). More particularly, the phase relationship detection result may represent a phase relationship of the first divided clock with respect to the second divided clock.

For example, when the synchronization module SM($x_0$+1) is configured to receive the first divided clock (e.g. the local clock $CLK_{LOCAL\_L/R}$ in the synchronization module SM($x_0$)) through the left side divided clock input pin i_sync_left($x_0$+1), to act as the external clock $CLK_{EXTERNAL\_L}$ of the synchronization module SM($x_0$+1), the electronic device 100 (e.g. the synchronization control circuit) may utilize the phase relationship detection circuit 330L in the synchronization module SM($x_0$+1) to perform the phase relationship detection on the external clock $CLK_{EXTERNAL\_L}$ according to the local clock $CLK_{LOCAL\_L}$ in the synchronization module SM($x_0$+1), to generate the data output signal $Q_L$ for acting as the phase relationship detection result signal (such as the current stage phase relationship detection result signal current_rst in the synchronization module SM($x_0$+1)). For another example, when the synchronization module SM($x_0$+1) is configured to receive the first divided clock (e.g. the local clock $CLK_{LOCAL\_L/R}$ in the synchronization module SM($x_0$)) through the right side divided clock input pin i_sync_right($x_0$+1), to act as the external clock $CLK_{EXTERNAL\_R}$ of the synchronization module SM($x_0$+1), the electronic device 100 (e.g. the synchronization control circuit) may utilize the phase relationship detection circuit 330R in the synchronization module SM($x_0$+1) to perform the phase relationship detection on the external clock $CLK_{EXTERNAL\_R}$ according to the local clock $CLK_{LOCAL\_R}$ in the synchronization module SM($x_0$+1), to generate the data output signal $Q_R$ for acting as the phase relationship detection result signal (such as the current stage phase relationship detection result signal current_rst in the synchronization module SM($x_0$+1)).

In Step S16, the electronic device 100 (e.g. the synchronization control circuit) may utilize a logic gate in the second synchronization control sub-circuit, such as the XOR gate 343 in the synchronization module SM($x_0$+1), to perform a logic operation (e.g. an XOR operation) on the first phase selection result output signal (e.g. the current stage phase selection result output signal o_sync_result($x_0$) of the synchronization module SM($x_0$), that is, the previous stage phase selection result input signal i_sync_pre_result($x_0$+1) of the synchronization module SM($x_0$+1)) and the phase relationship detection result signal (e.g. the current stage phase relationship detection result signal current_rst in the synchronization module SM($x_0$+1)), to generate a second phase selection result output signal (e.g. the current stage phase selection result output signal o_sync_result($x_{0+1}$) of the synchronization module SM($x_0$+1)), wherein the logic value carried by the second phase selection result output signal may indicate a second phase selection result of the second synchronization control sub-circuit (e.g. the synchronization module SM($x_0$+1)).

In Step S17, the electronic device 100 (e.g. the synchronization control circuit) may utilize the second synchronization control sub-circuit (e.g. the synchronization module SM($x_0$+1)) to output one of the second divided clock (e.g. the divided clock generated by the divide-by-2 frequency divider 310 in the synchronization module SM($x_0$+1)) and an inverted signal of the second divided clock (e.g. the inverted signal generated by the inverter 344 in the synchronization module SM($x_0$+1)) according to the second phase selection result output signal (e.g. the current phase selection result output signal o_sync_result($x_0$+1) output by the current stage phase selection result output pin of the synchronization module SM($x_0$+1)), for further use in a physical layer circuit (e.g. the physical layer circuit PHY($x_0$+1)) equipped with the second synchronization control sub-circuit.

According to the embodiment, the second synchronization control sub-circuit, such as the synchronization module SM($x_0$+1), may utilize the inverter 344 therein to: perform an inversion operation on the second divided clock to generate the inverted signal; select one of the second divided clock and the inverted signal as a divided clock of a selection according to the logic value carried by the second phase selection result output signal; and output the divided clock of the selection, for further use in the corresponding physical layer circuit PHY($x_0$+1). For example:

(1) when the logic value carried by the second phase selection result output signal is equal to the first predetermined logic value, such as the candidate logic value 1 (e.g. 1'b1), the second synchronization control sub-circuit (e.g. the synchronization module SM($x_0$+1)) may select the inverted signal as the divided clock of the selection; and (2) when the logic value carried by the second phase selection result output signal is equal to the second predetermined logic value, such as the candidate logic value 0 (e.g. 1'b0), the second synchronization control sub-circuit (e.g. the synchronization module SM($x_0$+1)) may select the second divided clock as the divided clock of the selection; but the present invention is not limited thereto. In some embodiments, if the logic value carried by the second phase selection result output signal is equal to the first predetermined logic value, such as the candidate logic value 1 (e.g. 1'b1), the second synchronization control sub-circuit (e.g. the synchronization module SM($x_0$+1)) may select the inverted signal as the divided clock of the selection; otherwise, the second synchronization control sub-circuit (e.g. the synchronization module SM($x_0$+1)) may select the second divided clock as the divided clock of the selection. For brevity, similar descriptions for this embodiment are not repeated in detail here.

For better comprehension, the method may be illustrated with the work flow shown in FIG. 9, but the present invention is not limited thereto. According to some embodiments, one or more steps may be added, deleted, or changed in the work flow shown in FIG. 9.

According to some embodiments, the left side and the right side in the above-mentioned embodiments may be replaced by a first side and a second side, respectively, such as any two sides in multiple predetermined sides (e.g. the top side, the bottom side, the left side, and the right side) of a certain circuit (e.g. the synchronization module SM(x)), and the terms "left side" and "right side" in related components (e.g. the left side module and the right side module) and corresponding pins/signals may be replaced by "first side" and "second side", respectively. For brevity, similar descriptions for these embodiments are not repeated in detail here.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for performing divided-clock phase synchronization in a multi-divided-clock system, comprising:
utilizing a first frequency divider in a first synchronization control sub-circuit to perform a first frequency division operation according to a source clock, to generate a first divided clock;
utilizing a second frequency divider in a second synchronization control sub-circuit to perform a second frequency division operation according to the source clock, to generate a second divided clock;
utilizing the first synchronization control sub-circuit to output the first divided clock to the second synchronization control sub-circuit;
utilizing the first synchronization control sub-circuit to output a first phase selection result output signal to the second synchronization control sub-circuit, wherein a logic value carried by the first phase selection result output signal indicates a first phase selection result of the first synchronization control sub-circuit;
utilizing a phase relationship detection circuit in the second synchronization control sub-circuit to perform phase relationship detection on the first divided clock according to the second divided clock, to generate a phase relationship detection result signal, wherein a logic value carried by the phase relationship detection result signal indicates a phase relationship detection result of the second synchronization control sub-circuit;
utilizing a logic gate in the second synchronization control sub-circuit to perform a logic operation on the first phase selection result output signal and the phase relationship detection result signal, to generate a second phase selection result output signal, wherein a logic value carried by the second phase selection result output signal indicates a second phase selection result of the second synchronization control sub-circuit; and
utilizing the second synchronization control sub-circuit to output one of the second divided clock and an inverted signal of the second divided clock according to the second phase selection result output signal, for further use in a physical layer circuit equipped with the second synchronization control sub-circuit.

2. The method of claim 1, wherein the phase relationship detection result represents a phase relationship of the first divided clock with respect to the second divided clock.

3. The method of claim 1, wherein the logic gate in the second synchronization control sub-circuit represents an exclusive OR (XOR) gate, and the logic operation represents an XOR operation.

4. The method of claim 1, wherein utilizing the second synchronization control sub-circuit to output one of the second divided clock and the inverted signal of the second divided clock according to the second phase selection result output signal, for further use in the physical layer circuit equipped with the second synchronization control sub-circuit further comprises:
utilizing an inverter in the second synchronization control sub-circuit to perform an inversion operation on the second divided clock, to generate the inverted signal;
selecting one of the second divided clock and the inverted signal as a selected divided clock according to the logic value carried by the second phase selection result output signal; and
utilizing the second synchronization control sub-circuit to output the selected divided clock, for further use in the physical layer circuit equipped with the second synchronization control sub-circuit.

5. The method of claim 4, wherein selecting one of the second divided clock and the inverted signal as the selected divided clock according to the logic value carried by the second phase selection result output signal further comprises:
in response to the logic value carried by the second phase selection result output signal being equal to a first predetermined logic value, selecting the inverted signal as the selected divided clock.

6. The method of claim 5, wherein selecting one of the second divided clock and the inverted signal as the selected divided clock according to the logic value carried by the second phase selection result output signal further comprises:
in response to the logic value carried by the second phase selection result output signal being equal to a second predetermined logic value, selecting the second divided clock as the selected divided clock.

7. The method of claim 4, wherein selecting one of the second divided clock and the inverted signal as the selected divided clock according to the logic value carried by the second phase selection result output signal further comprises:
in response to the logic value carried by the second phase selection result output signal being equal to a first predetermined logic value, selecting the inverted signal as the selected divided clock; otherwise, selecting the second divided clock as the selected divided clock.

8. The method of claim 1, wherein a plurality of synchronization control sub-circuits equipped with same circuit architecture comprise the first synchronization control sub-circuit and the second synchronization control sub-circuit, and the method further comprises:
utilizing the plurality of synchronization control sub-circuits to couple to each other, to form a synchronization control circuit, for synchronizing divided clocks generated by respective frequency dividers of the plurality of synchronization control sub-circuits.

9. The method of claim 8, wherein in the synchronization control circuit, any two adjacent synchronization control sub-circuits in the plurality of synchronization control sub-circuits perform signal exchange in a manner similar to that between the first synchronization control sub-circuit and the second synchronization control sub-circuit.

10. A synchronization control circuit operated according to the method of claim 1, wherein the synchronization control circuit comprises:
a plurality of synchronization control sub-circuits, equipped with same circuit architecture and coupled to each other, and arranged to synchronize divided clocks generated by respective frequency dividers of the plurality of synchronization control sub-circuits, wherein the plurality of synchronization control sub-circuits comprise the first synchronization control sub-circuit and the second synchronization control sub-circuit.

11. A synchronization control sub-circuit, wherein the synchronization control sub-circuit is one of a plurality of synchronization control sub-circuits in a synchronization control circuit, and the synchronization control sub-circuit comprises:
- a frequency divider, arranged to perform a frequency division operation according to a source clock, to generate a divided clock;
- a phase relationship detection circuit, coupled to the frequency divider, and arranged to perform phase relationship detection on another divided clock output of another synchronization control sub-circuit, to generate a phase relationship detection result signal, wherein a logic value carried by the phase relationship detection result signal indicates a phase relationship detection result of the synchronization control sub-circuit;
- a logic gate, coupled to the phase relationship detection circuit, and arranged to perform a logic operation on a first phase selection result output signal output by the another synchronization sub-circuit and the phase relation detection result signal, to generate a second phase selection result output signal, wherein a logic value carried by the first phase selection result output signal indicates a first phase selection result of the another synchronization control sub-circuit, and a logic value carried by the second phase selection result output signal indicates a second phase selection result of the synchronization control sub-circuit; and
- a synchronized divided output clock pin, wherein through the synchronized divided output clock pin, the synchronization control sub-circuit outputs one of the divided clock and an inverted signal of the divided clock according to the second phase selection result output signal, for further use in a physical layer circuit equipped with the synchronization control sub-circuit.

12. The synchronization control sub-circuit of claim 11, wherein the phase relationship detection result represents a phase relationship of the another divided clock with respect to the divided clock.

13. The synchronization control sub-circuit of claim 11, wherein the logic gate represents an exclusive OR (XOR) gate, and the logic operation represents an XOR operation.

14. The synchronization control sub-circuit of claim 11, further comprising:
- an inverter, arranged to perform an inversion operation on the divided clock, to generate the inverted signal; and
- a multiplexer circuit, coupled to the logic gate, the frequency divider, and the inverter, and arranged to select one of the divided clock and the inverted signal as a selected divided clock according to the logic value carried by the second phase selection result output signal;

wherein the synchronization control sub-circuit outputs the selected divided clock, for further use in the physical layer circuit equipped with the synchronization control sub-circuit.

15. The synchronization control sub-circuit of claim 14, wherein when the logic value carried by the second phase selection result output signal is equal to a first predetermined logic value, the multiplexer circuit selects the inverted signal as the selected divided clock.

16. The synchronization control sub-circuit of claim 15, wherein when the logic value carried by the second phase selection result output signal is equal to a second predetermined logic value, the multiplexer circuit selects the divided clock as the selected divided clock.

17. The synchronization control sub-circuit of claim 14, wherein if the logic value carried by the second phase selection result output signal is equal to a first predetermined logic value, the multiplexer circuit selects the inverted signal as the selected divided clock of the selection; otherwise, the multiplexer circuit selects the divided clock as the selected divided clock.

18. The synchronization control sub-circuit of claim 11, wherein the plurality of synchronization control sub-circuits are equipped with same circuit architecture, and the synchronization control sub-circuit is configurable to allow the plurality of synchronization control sub-circuits to couple to each other, to form the synchronization control circuit for synchronizing divided clocks generated by respective frequency dividers of the plurality of synchronization control sub-circuits.

19. The synchronization control sub-circuit of claim 18, wherein in the synchronization control circuit, any two adjacent synchronization control sub-circuits in the plurality of synchronization control sub-circuits perform signal exchange in a manner similar to that between the another synchronization control sub-circuit and the synchronization control sub-circuit.

20. An electronic device comprising the synchronization control sub-circuit of claim 11, wherein the electronic device further comprises:
- a memory, arranged to temporarily store information for the electronic device; and
- a plurality of physical layer circuits, coupled to the memory, and arranged to access the memory to execute operations of the electronic device, wherein each of the plurality of physical layer circuits comprises a corresponding synchronization control sub-circuit in the plurality of synchronization control sub-circuits.

* * * * *